(12) United States Patent
Claussen et al.

(10) Patent No.: US 7,248,647 B2
(45) Date of Patent: Jul. 24, 2007

(54) RADIO TELECOMMUNICATIONS SYSTEM OPERATIVE BY INTERACTIVE DETERMINATION OF SOFT ESTIMATES, AND A CORRESPONDING METHOD

(75) Inventors: Holger Claussen, Swindon (GB); Hamid Reza Karimi, Swindon (GB)

(73) Assignee: Lucent Technologies Inc., Murray Hill, NJ (US)

( * ) Notice: Subject to any disclaimer, the term of this patent is extended or adjusted under 35 U.S.C. 154(b) by 756 days.

(21) Appl. No.: 10/643,182

(22) Filed: Aug. 18, 2003

(65) Prior Publication Data

US 2004/0038653 A1    Feb. 26, 2004

(30) Foreign Application Priority Data

Aug. 21, 2002   (EP)   ................... 02255820

(51) Int. Cl.
| | |
|---|---|
| H04L 27/20 | (2006.01) |
| H04L 27/28 | (2006.01) |
| H03K 9/10 | (2006.01) |
| H04Q 7/00 | (2006.01) |
| H03C 3/00 | (2006.01) |

(52) U.S. Cl. ................. 375/308; 332/103; 375/260; 375/269; 370/334; 455/500; 455/103

(58) Field of Classification Search .............. 375/133, 375/141, 260, 267, 269, 279, 295, 299, 308, 375/316, 329, 349; 455/500, 103; 370/320, 370/334, 335, 342, 441; 332/103
See application file for complete search history.

(56) References Cited

U.S. PATENT DOCUMENTS 6,044,073 A * 3/2000 Seshadri et al. ............ 370/342

(Continued)

FOREIGN PATENT DOCUMENTS

| WO | WO 01/69873 A2 | 9/2001 |
|---|---|---|
| WO | WO 02/41594 A1 | 5/2002 |

OTHER PUBLICATIONS

Isaka, M. et al: "On the Interactive Decoding of Multilevel Codes", IEEE Journal of Selected Areas in Communications, IEEE Inc. New York, U.S., vol. 19, No. 5, May 2001 pp. 935-943, XP001101013 ISSN: 0733-8716.

(Continued)

Primary Examiner—David C. Payne
Assistant Examiner—Aslan Ettehadieh

(57) ABSTRACT

A system to communicate digital data symbols with higher than QPSK modulation comprises a transmitter and receiver. The transmitter comprises, a modulator and circuitry to split and encode the data into a first block of more significant bits and a second block of less significant bits for modulating by. The receiver receives digital data bits by iterative determination of soft estimates of bits followed by a hard decision as to what bit was intended, and comprises a first processor to provide first soft estimates of bits of the received signal, and a second processor to decode the first soft estimates and to provide second soft estimates of the bits. The receiver also comprises a first combiner to provide adapted first soft estimates to the second processor, the adapted first soft estimates of each bit being dependent upon the respective first soft estimate and a respective previous first soft estimate, and a second combiner to provide third soft estimates back to the first processor for subsequent further decoding, the third soft estimates of each bit being dependent upon the respective second soft estimate and a respective previous second soft estimate.

8 Claims, 8 Drawing Sheets

U.S. PATENT DOCUMENTS

| | | | |
|---|---|---|---|
| 6,735,258 B1* | 5/2004 | Trott et al. | 375/308 |
| 7,106,813 B1* | 9/2006 | Ling | 375/343 |
| 2002/0051499 A1* | 5/2002 | Cameron et al. | 375/295 |
| 2003/0112901 A1* | 6/2003 | Gupta | 375/340 |
| 2003/0147471 A1* | 8/2003 | Simon et al. | 375/295 |
| 2004/0038653 A1* | 2/2004 | Claussen et al. | 455/130 |

OTHER PUBLICATIONS

Tonello, A. M.: "Space-Time Bit-Interleaved Coded Modulation Over Frequency Selective Fading Channels with Interactive Decoding", Globecom'00. 2000 IEEE Global Telecommunications Conference. San Francisco, CA, Nov. 27, 2000-Dec. 1, 2000, IEEE Global Telecommunications Conference, New York, NY: IEEE, U.S. vol. 3 of 3, Nov. 27, 2000, pp. 1616-1620, XP002180266 ISBN: 0-7803-6452-X.

Li, X. et al: "Effects of Interactive Detection and Decoding on the Performance of Blast", Globecom'00. 2000 IEEE Global Telecommunications Conference, San Francisco, CA, Nov. 27, 2000-Dec. 1, 2000, IEEE Global Telecommunications Conference, New York, NY: IEEE, U.S., vol. 2 of 4, Nov. 27, 2000, pp. 1061-1066, XP001017247 ISBN: 0-7803-6452-X.

* cited by examiner

SUCCESSIVE INTERFACE CANCELLATION OVERVIEW (i) Detection step 1

(ii) Detection step 2

(iii) Detection step 3

(iv) Detection step 4

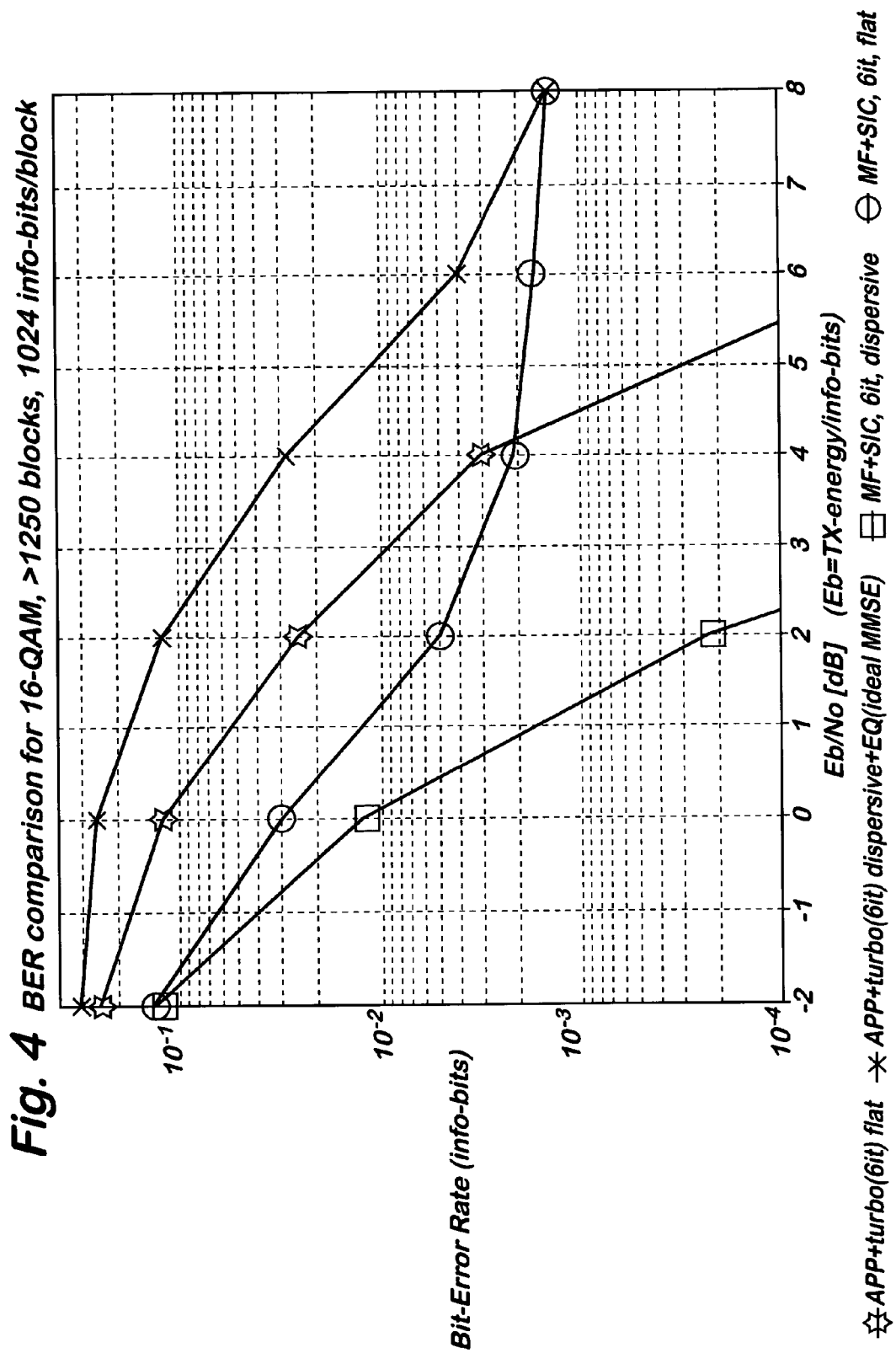

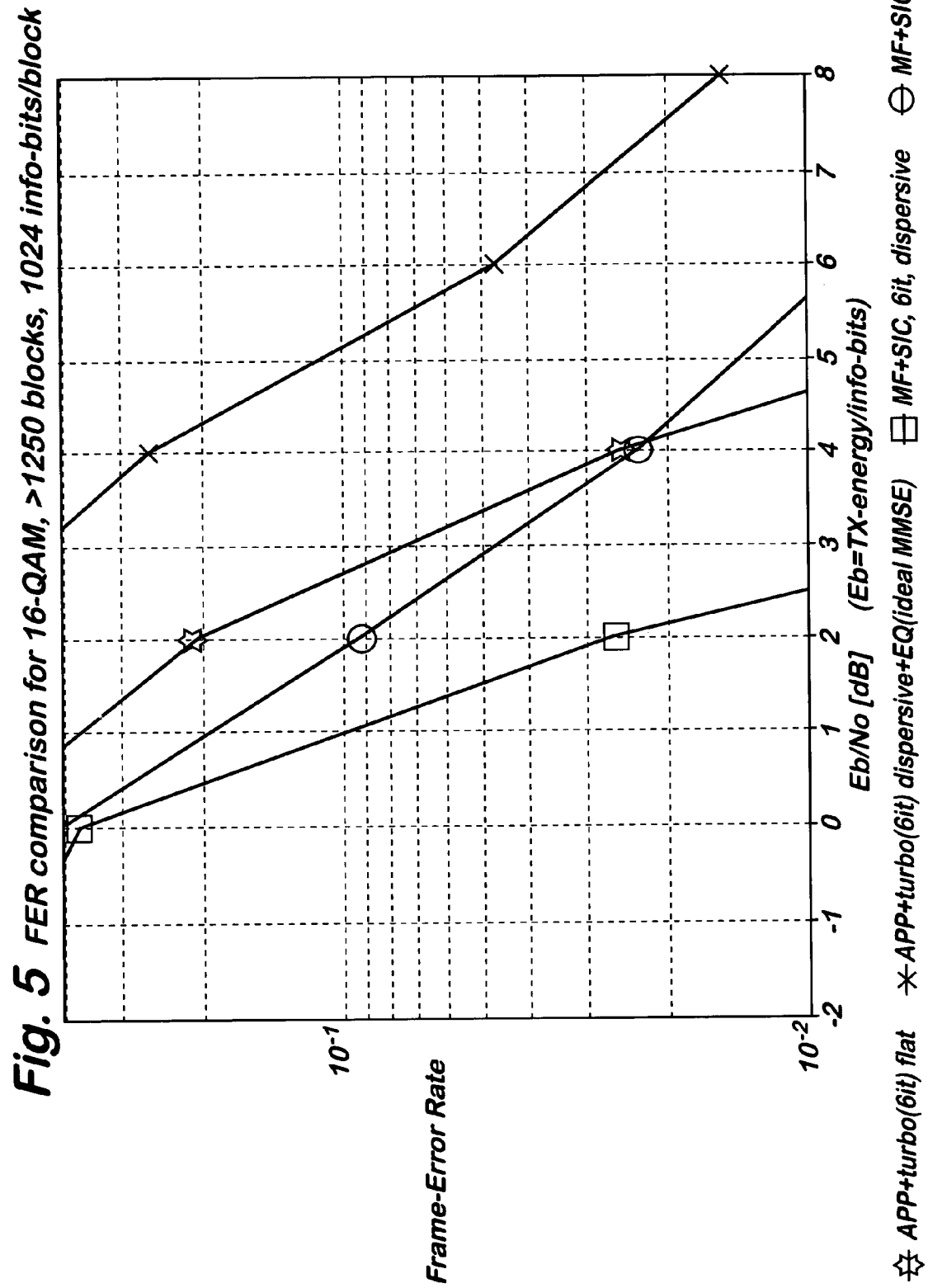

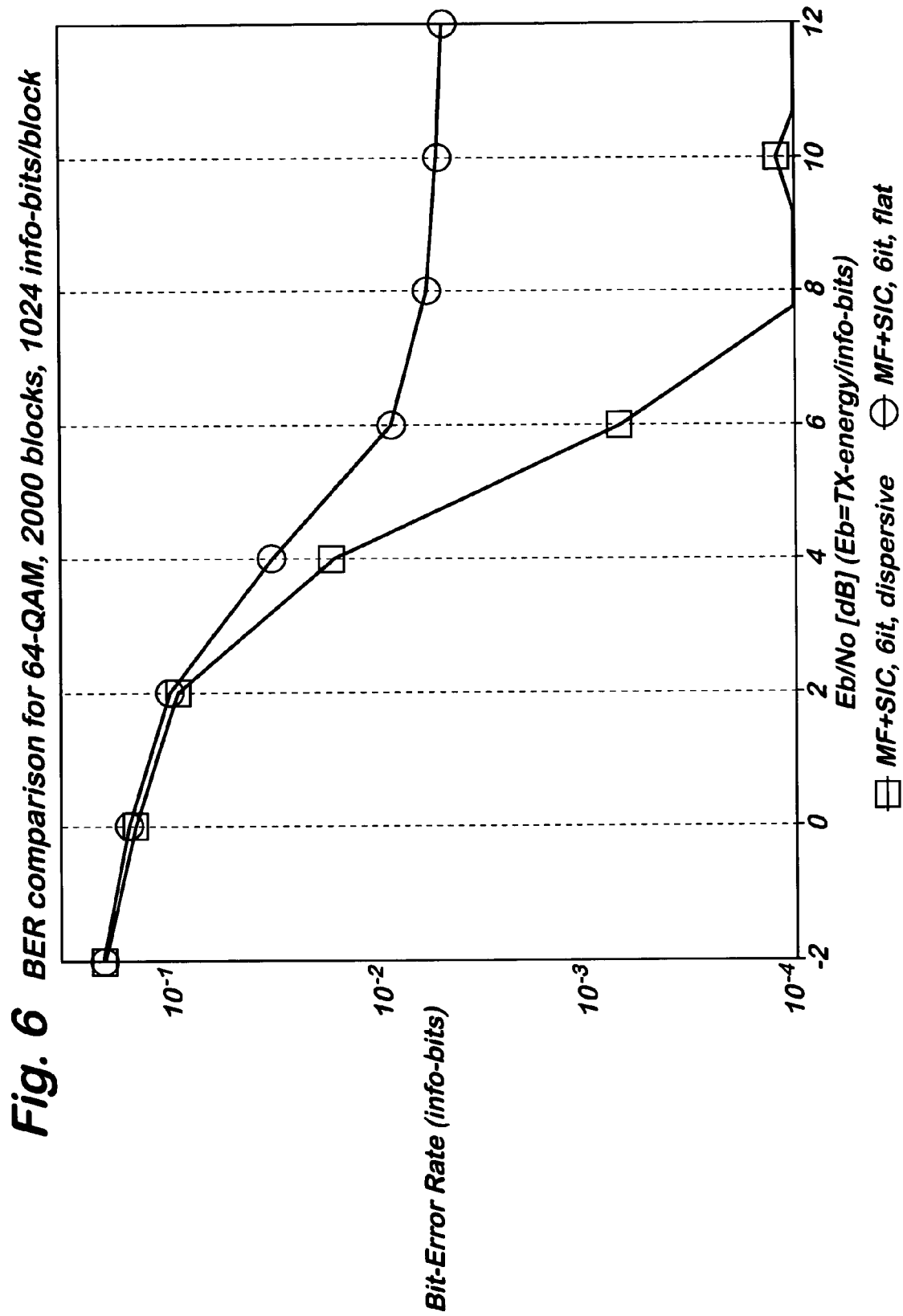
Fig. 6 BER comparison for 64-QAM, 2000 blocks, 1024 info-bits/block

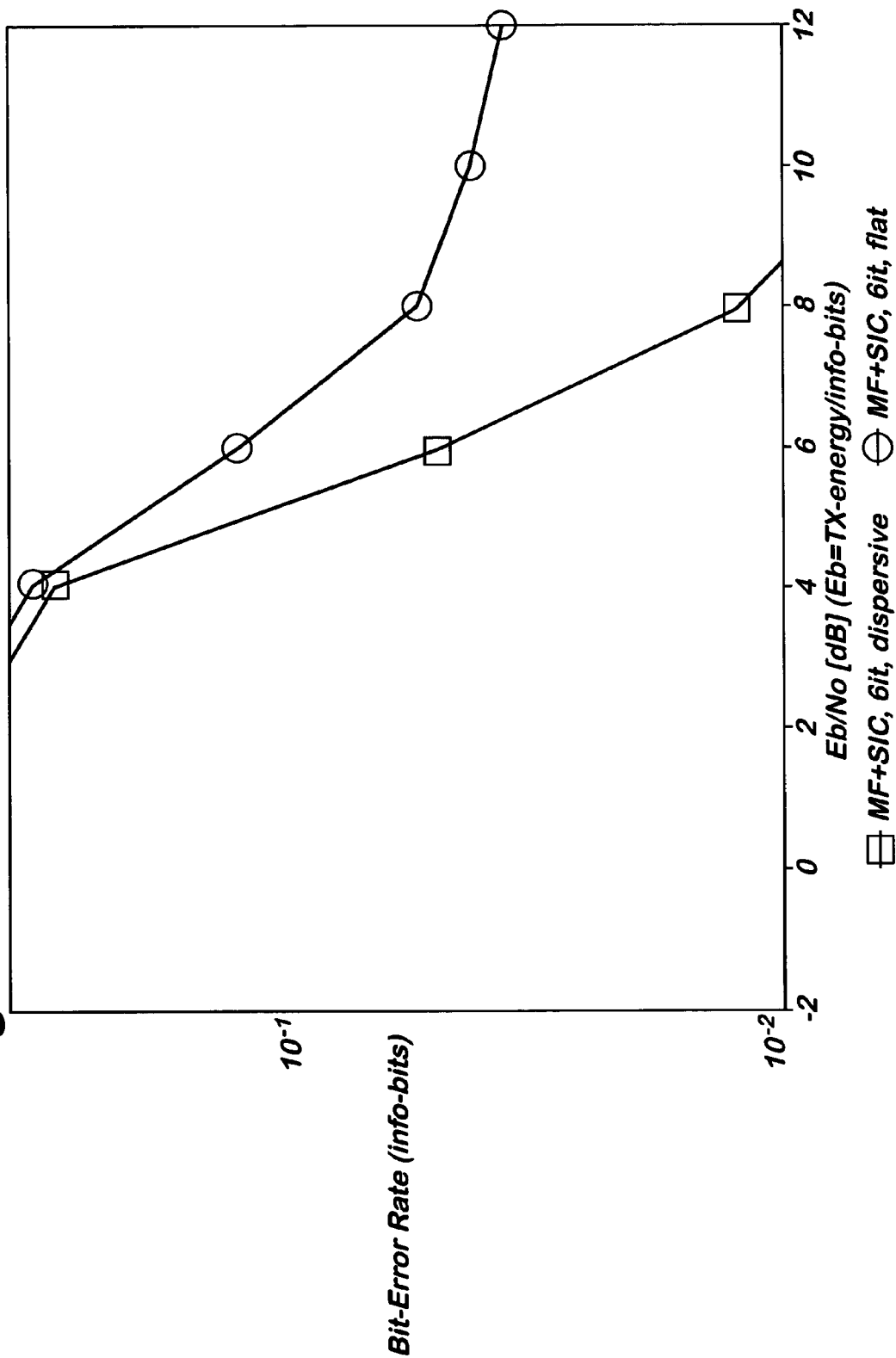

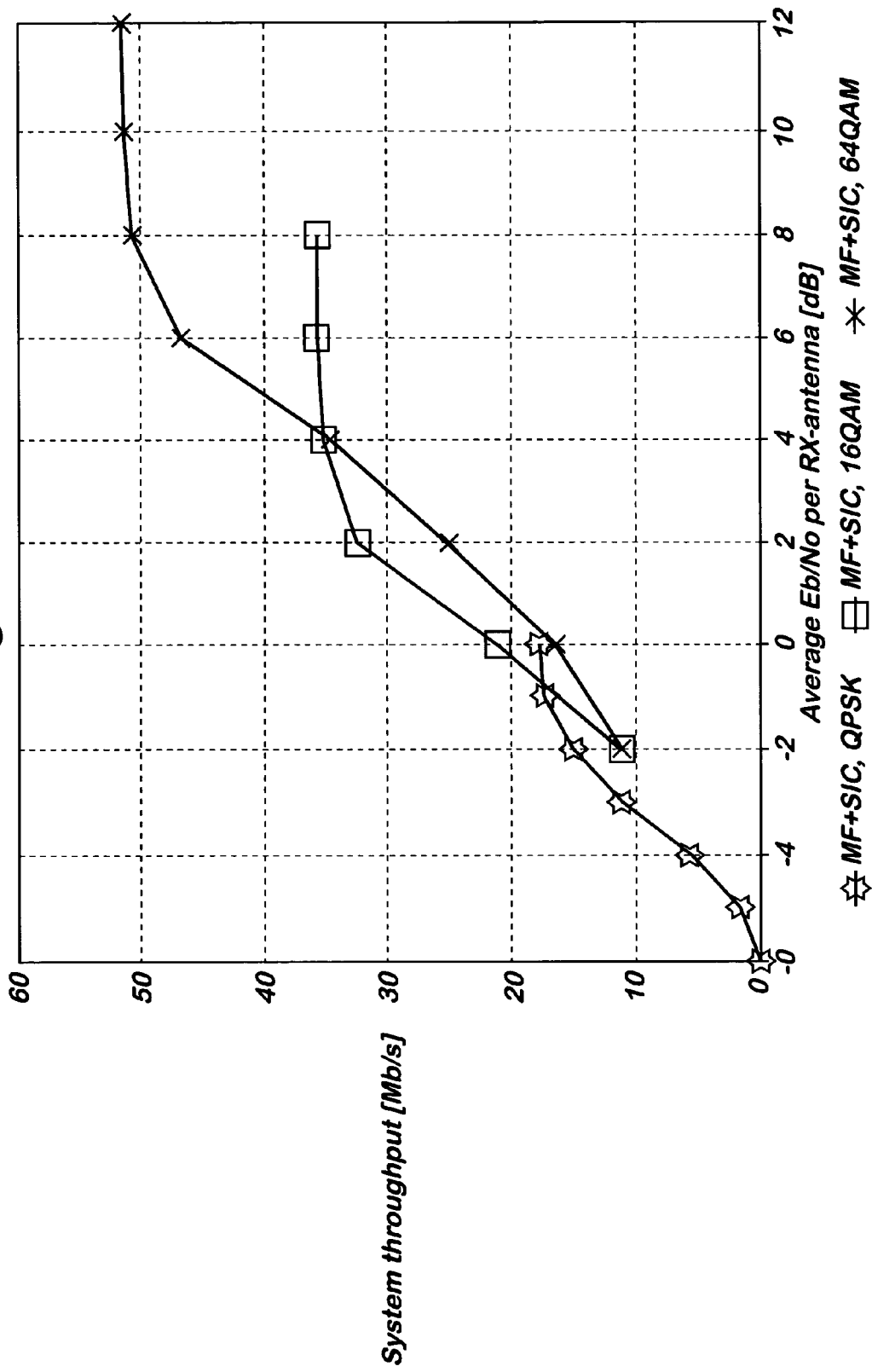

US 7,248,647 B2

RADIO TELECOMMUNICATIONS SYSTEM OPERATIVE BY INTERACTIVE DETERMINATION OF SOFT ESTIMATES, AND A CORRESPONDING METHOD

CROSS REFERENCE TO RELATED APPLICATION

This application claims priority of European Application No. 02255820.9 filed on Aug. 21, 2002.

TECHNICAL FIELD

The present invention relates to telecommunications and, more particularly, to wireless communications.

BACKGROUND OF THE INVENTION

Turbo-encoded, multiple-input multiple-output ("MIMO") systems have been proposed for the support of high-speed downlink packet access ("HSDPA") in UMTS. The concept here may be to increase the achievable data rates for a particular user through a combination of code re-use across transmit antennas and higher-order modulation schemes. The code re-use inevitably may result in high levels of interference at the mobile receiver, even under non-dispersive channel conditions. In order to tackle such high interference levels, receivers based on an optimal a posteriori probability ("APP") detector. To cope with dispersive channels and in order to avoid sequence estimation, it may be necessary to use an APP detector preceded by a matrix channel equalizer.

Essentially, the APP detector may operate by computing soft-outputs for the transmitted bits, which most closely match the received signal in an Euclidian sense. The computational complexity of the APP detector may be an exponential function of the total number of bits transmitted during a symbol epoch, which is equal to the product of the number of transmit antennas and the number of bits per symbol. Consequently, the complexity of the APP detector can become prohibitive for increasing numbers of transmit antennas and modulation orders. This inflexibility of the optimal APP detector has resulted in renewed interest in the use of suboptimal but less complex MIMO detectors.

Successive interference cancellation ("SIC") schemes have been considered for many years in the context of multi-user detection for the CDMA uplink. These schemes may combat interference by successively detecting and canceling the influence of data streams from the received signal. The more reliable data streams may be detected and cancelled first. In the context of MIMO receivers, a SIC architecture incorporating ordering and detection may be based on the minimum mean-squared error ("MMSE") criterion. Furthermore, significant performance improvements might have been demonstrated through iterations between the MIMO detector and a convolutional decoder.

SUMMARY OF THE INVENTION

The present invention provides a radio telecommunications system operative to communicate digital data symbols with higher than quadrature phase shift keying ("QPSK") modulation, the system comprising a transmitter and a receiver, the transmitter comprising a modulator and means to split and encode the data into a first block of more significant bits of symbols and a second block of less significant bits of the symbols for modulating by the modulator, the receiver being operative to receive digital data bits by iterative determination of soft estimates of bits followed by a hard decision as to what bit was intended, the receiver comprising a first processor operative to provide first soft estimates of bits of the received signal, a second processor operative to decode the first soft estimates and to provide second soft estimates of the bits, a first combiner operative to provide adapted first soft estimates to the second processor, the adapted first soft estimates of each bit being dependent upon the respective first soft estimate and a respective previous first soft estimate, a second combiner operative to provide third soft estimates back to the first processor for subsequent further decoding, the third soft estimates of each bit being dependent upon the respective second soft estimate and a respective previous second soft estimate.

Embodiments of the present invention provide a layered encoding scheme, whereby bits which may be given equivalent protection by the modulation scheme may be encoded together in one block. In this way the well-protected bits can be detected and their interference cancelled independently of the less-protected bits.

Exploiting the layered encoding scheme in the receiver may improve the BER at the output of the MF-SIC detector and allows successful initialisation of the iterative detection/decoding process. This may allow the use of an iterative MF-SIC receiver to deal with higher order modulation schemes (16-QAM, 64-QAM,) and may offer superior performance over the known solution (namely an equalized APP/spherical APP receiver), but at significantly lower computational complexity. In consequence, the integrated circuit chip upon which the detector and decoder circuit may be implemented can be smaller.

The resulting bit-based detection makes optimal detection ordering possible for higher-order modulation schemes.

Embodiments of the present invention incorporate layered encoding of bit groups, depending on the level of protection provided by the modulation scheme to allow the use of iterative MF-SIC receivers with 16- and 64-QAM modulation. In fact, all receivers based on successive cancellation, like the original BLAST detector, can be improved by the proposed scheme.

In embodiments of the present invention, an iterative MF-SIC receiver may be extended to take advantage of a layered encoding scheme. This may allow highly scalable receiver architectures that can offer superior performance in comparison to known equalized APP/spherical APP receivers, at significantly lower complexity.

Embodiments of the present invention may provide a bit-based successive interference cancellation ("SIC") scheme incorporating simple matched filters (MF) as the basic detection unit is considered as a receiver for a convolutionally-encoded MIMO link. The MF-SIC detector may perform iterations with a convolutional decoder in conjunction with a soft-output combining technique. Convolutional coding is used, since it provides better convergence than turbo coding in iterative schemes. The combining acts to suppress instabilities caused by erroneously detected and cancelled bits. The resulting receiver architecture may be highly scalable in terms of dealing with growing numbers of transmit antennas and high-order modulation schemes.

The means comprises a first convolutional encoder operative to produce blocks of the more significant bits, a second convolutional encoder operative to produce blocks of less significant bits, and respective interleavers may each be operative to interleave the blocks from the associated encoder into a respective data stream for modulating. The transmitter further comprises a spreader for spreading by the application of spreading codes.

In use, at the receiver, the soft estimates of multiple data streams which are multiplexed into one stream at the output of the first processor, and may be provided to the first combiner to provide the adapted first soft estimates which are deinterleaved by a deinterleaver before being passed to the second processor, and the third soft estimates provided by the second combiner are interleaved by an interleaver before being passed back to the first processor.

The first processor may be a successive interference cancellation SIC multiple input multiple output MIMO detector and the second processor is a convolutional decoder, the soft estimates being log likelihood ratios.

The SIC MIMO detector may include one or more matched filters for detection.

The modulation scheme may be 16 Quadrature amplitude modulation, the first two bits of a symbol being provide by the first convolutional encoder, and the last two bits of a symbol being provided by the second convolutional encoder.

Alternatively, the modulation scheme may be 64 Quadrature amplitude modulation, the first two bits of a symbol being provide by the first convolutional encoder, and the last two bits of a symbol being provided by convolutional encoder, the intermediate two bits being provided by a third convolutional encoder.

In use, at the receiver, a plurality of detection iterations each involving the first processor, second processor and the combiners may be performed whereupon a hard decision may be made as to what bit(s) was/were intended.

The more significant bits are detected in the received signal in a first series of iterations, their estimated contribution to the received signal being subtracted to provide a modified received signal from which the less significant bits may be detected by a second series of iterations.

Furthermore, the estimated contribution of the less significant bits to the received signal may be subtracted to provide a further modified received signal from which the more significant bits may be detected by a third series of iterations.

Furthermore, the estimated contribution to the received signal of the more significant bits may be detected in the further modified received signal in the third series of iterations is subtracted to provide a yet further modified received signal from which the less significant bits may be detected by a fourth series of iterations.

The present invention may also provides a radio telecommunications transmitter operative to send digital data symbols with higher than quadrature phase shift keying (QPSK) modulation, the transmitter comprising a modulator and means to split and encode the data into a first block of more significant bits of symbols and a second block of less significant bits of the symbols for modulating by the modulator, the means comprising a first convolutional encoder operative to produce a block of the more significant bits, a second convolutional encoder operative to produce a block of less significant bits, and respective interleavers each operative to interleave the blocks from the associated encoder into a data stream for modulating. The transmitter further comprises a spreader for spreading the data stream by the application of spreading codes.

The present invention may also provide a method of communicating digital data symbols with higher than quadrature phase shift keying (QPSK). The method comprising the steps of splitting and encoding the data into a first block of more significant bits and a second block of less significant bits for modulating by a modulator receiving digital data bits by iterative determination of soft estimates of symbols or bits followed by a hard decision as to what bit was intended, by providing first soft estimates of bits of the received signal,
decoding the first soft estimates and providing second soft estimates of the bits,
providing adapted first soft estimates, the adapted first soft estimates of each bit being dependent upon the respective first soft estimate and a respective previous first soft estimate,
providing third soft estimates back to the first processor for subsequent further decoding, the third soft estimates of each bit being dependent upon the respective second soft estimate and a respective previous second soft estimate.

BRIEF DESCRIPTION OF THE DRAWINGS

The present invention will be better understood from reading the following description of non-limiting embodiments, with reference to the attached drawings, wherein below:

FIG. 4 is a graph of expected Bit error rates against bit energy/noise energy as compared to a known APP detector with 16 QAM;

FIG. 5 is a graph of expected Frame error rates against bit energy/noise energy as compared to a known APP detector with 16 QAM;

FIG. 6 is a graph of expected Bit error rates against bit energy/noise energy as compared to a known APP detector with 64 QAM;

FIG. 7 is a graph of expected Frame error rates against bit energy/noise energy as compared to a known APP detector with 64QAM; and FIG. 8 is a graph of system throughput rate against bit energy/noise energy for the detector.

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION

System Architecture with a SIC MIMO Detector

Figure 1:
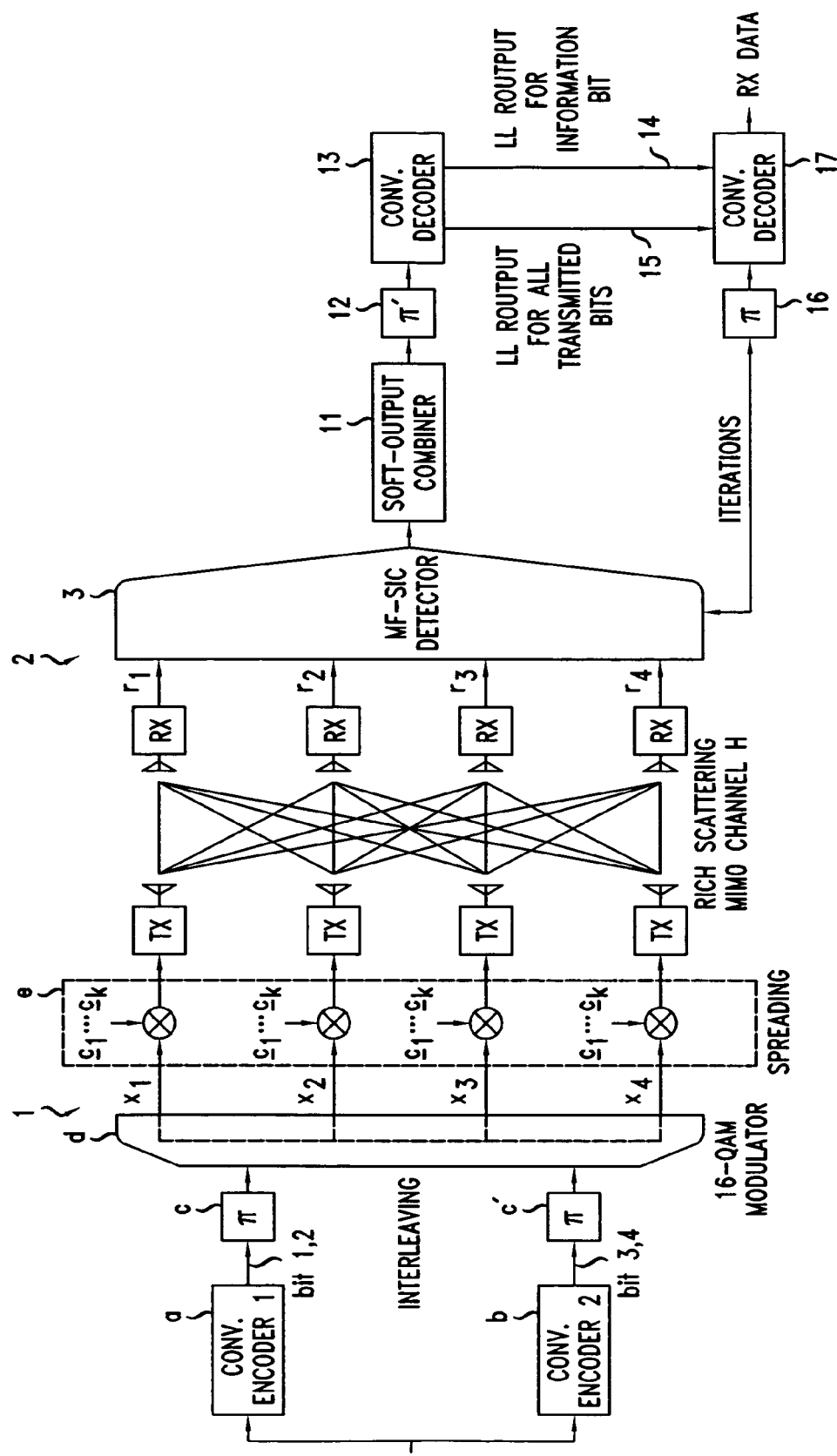
FIG. 1 is a diagrammatic illustration of a telecommunications transmitter and receiver including a transmitter and receiver according a first embodiment.

The system consists of a transmitter 1 and a receiver 2, as shown in FIG. 1. An example based on 16 QAM is described.

Transmitter

At the transmitter 1, in higher order modulation schemes such as 16-QAM or 64-QAM, the modulated bits are not equally protected, as shown in FIG. 3(a) which is described in more detail later. It will be seen in FIG. 3(a) that the average distances between the respective third and fourth bits of a symbol is half the average distances between respective first and second bits of symbols. It can thus be considered that the third and fourth bits are lower energy than the first and second bits, and therefore are less protected against errors. This fact can be used to introduce a layered encoding scheme, whereby bits which are given equivalent protection by the modulation scheme are encoded together in one block. This allows us to first detect and decode the bit blocks which are well-protected by the modulation scheme, and subsequently subtract their contribution from the received signal in order to reduce the interference for the remaining less-protected bit blocks. In this way, the received, 16 QAM (or 64 QAM) modulated signal can be treated as the sum of separately encoded QPSK data-streams which can be detected with an iterative MF-SIC receiver.

Accordingly, as regards the transmitter 1 shown in FIG. 1, a layered transmission scheme is provided. The transmitted signal (Tx data) is split into blocks of equal length which are separately encoded using a convolutional code by respective convolutional encoders a, b. The output bits of encoder a are the higher energy bits (i.e. first and second bits of a 16 QAM symbol) whilst the output of the encoder b are the lower energy bits (i.e. third and fourth bits of the symbol).

The streams are interleaved by respective interleaver c,c' and subsequently, modulated by 16QAM modulator d and spread by spreader e with the same spreading code and transmitted from transmitting antennas TX. Therefore, the propagation environment, which is assumed to exhibit significant multipath (so-called rich scattering) may be exploited to achieve the signal separation at the receiver.

Receiver

Figure 2:
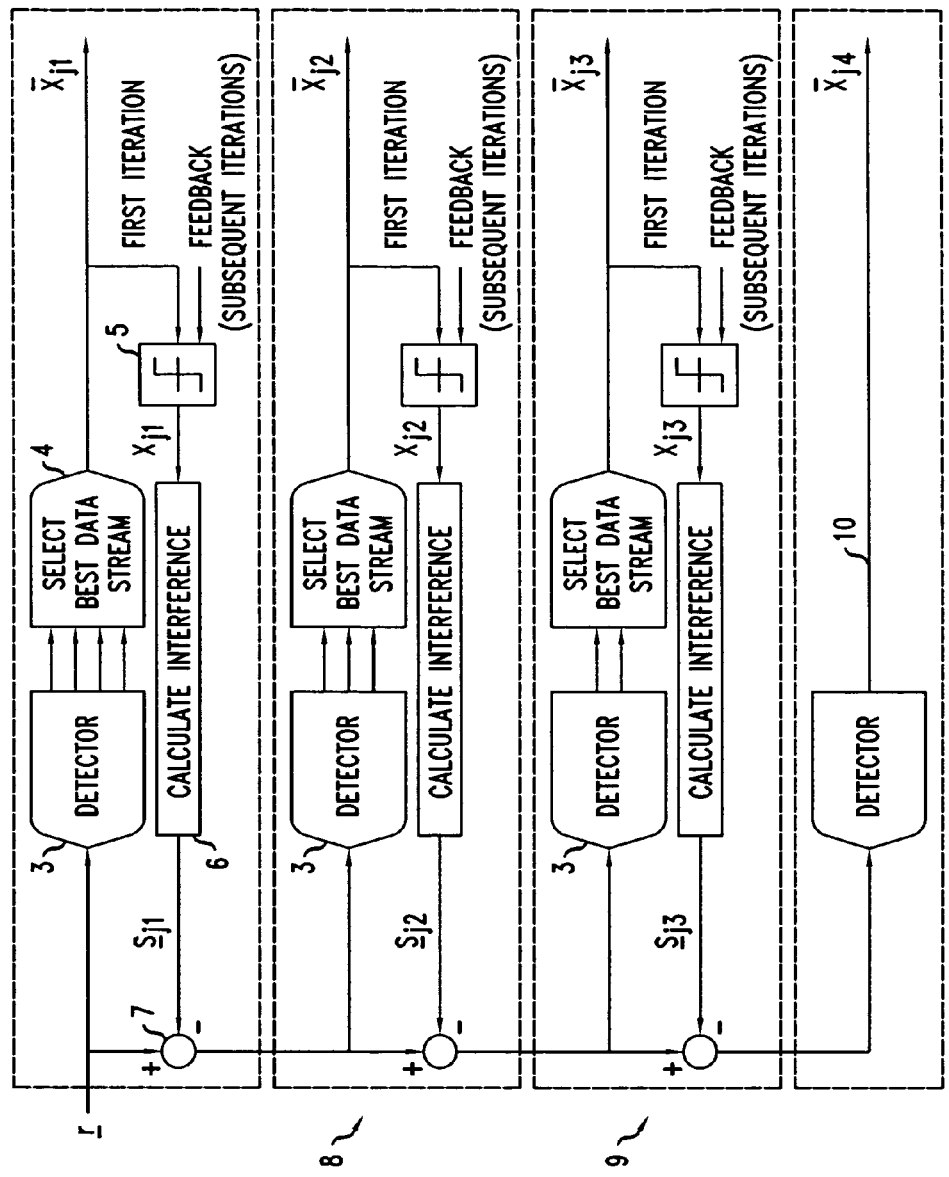
FIG. 2 is a diagrammatic illustration of operation of the receiver shown in FIG. 1.

At the receiver 2, the transmitted bits are detected with a successive cancellation MIMO SIC detector 3 as shown in FIGS. 1 and 2, based on matched filter (MF) detection as explained in more detail below.

As shown in FIG. 2, the received signal r, which contains all received signal vectors $r_k(k=1 \ldots n_R)$ from the $n_R$ receiver antennas RX, is fed into the SIC MIMO detector 3 which detects all transmitted symbols $x_1 \ldots x_{n_T}$ and determines the most reliable data estimate according to the particular order metric used (as described in more detail below). Ideally, the data with lowest error probability is selected (reference numeral 4). The next step is to make a hard decision (step 5) on the symbol or bit of the selected data, and to reconstruct its interference 6 by, for each antenna, calculating what received signal would have produced a 1 or −1 decision exactly (without error). Finally, the interference is subtracted (step 7) from all received signals $r_k$.

When the decision on the selected symbol or bit was correct, its multiple access interference is cancelled completely, however a wrong decision doubles the interference of the detected symbol or bit Therefore, the order metric is of crucial importance for the performance of successive cancellation detectors. In the first iteration, either of two order metrics for detection and cancellation of the received data streams are applied: ordering dependent on the least mean-squared error (LMSE) for symbol-based detection, and the ordering dependent on the instantaneous error probabilities (as indicated by the magnitude values of the log-likelihood ratios (mentioned below)) within each symbol period, for bit-based detection. This detection and cancellation process is continued in repeated cycles (steps 8,9) until all data streams are detected.

Soft estimates are then generated and output by the SIC MIMO detector 3 as follows. After the detection of the whole interleaved sequence, all received data streams (soft outputs) are multiplexed to one data stream which is output 11. The output from the SIC MIMO detector 3 is provided to a soft output combiner 11' (described in more detail below). The output from the soft output combiner 11' is then provided to deinterleaver 12 for deinterleaving and then decoding by convolutional decoder 13. The process of successive cancellation, deinterleaving and decoding represents the first iteration 14 of the iterative detector.

The subsequent iterations are based on the convolutional decoder 13 output of the whole transmitted sequence to improve the performance of the detector. Therefore, the decoder 13 output of all transmitted bits 15 is interleaved again 16, and fed back to the successive cancellation detector 3. Now, the interleaved decoder output is used for the order calculation and cancellation at the detector 3. This improves the quality of the detector soft-outputs in each iteration, because the reliability of the decoder output is much higher than the initial estimates from the matched filter within the SIC MIMO detector 3. In each following iteration, soft output combining in soft output combiner 17 is necessary to stabilize the decoder outputs. In this example, the soft outputs are log-likelihood ratios (LLR). Log-likelihood ratios (LLRs) are, of course, the logarithmic ratio of the probability that a bit is correct to the probability that it is not.

Detection Process for Higher Order Modulations

Figure 3:
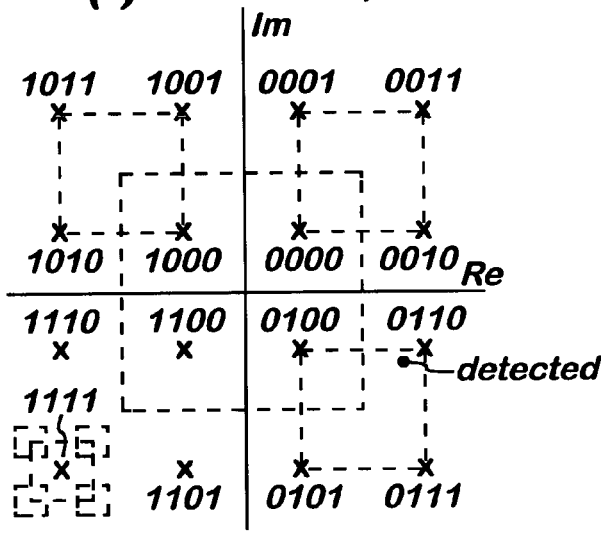
FIG. 3 is a diagram showing the detection process for 16 Quadrature Amplitude Modulation (16QAM)
Figure 3:
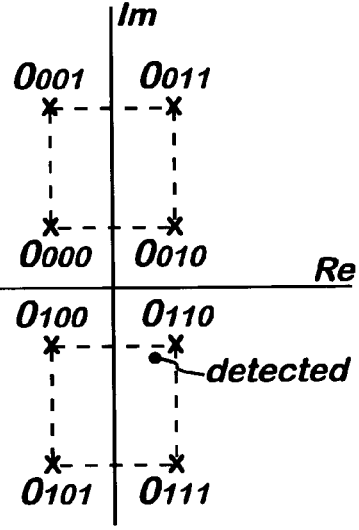
Figure 3:
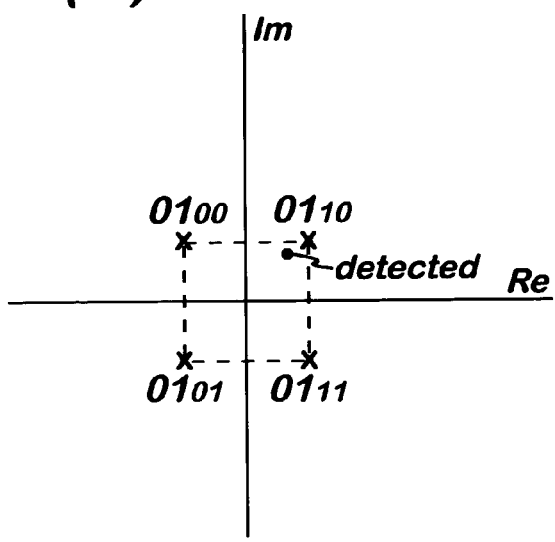
Figure 3:
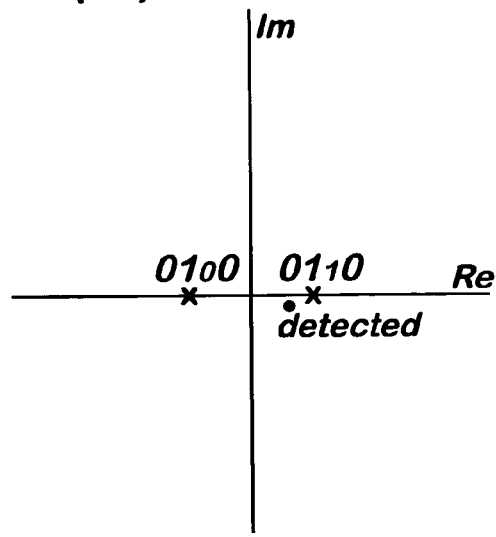

The layered encoded signal is received and processed. A typical detection process in the receiver 2 for 16QAM is as follows, and operates as shown in FIG. 3. FIG. 3 illustrates this process of bit-cancellation from a 16-QAM modulated symbol. In this case the first and second bits of each symbol are the most reliable bits and are encoded as one block. The remaining (i.e. third and fourth) bits of each symbol are encoded separately as a lower reliability bit stream.

The detection process is as follows:

1. Detect higher reliability bit stream (first and second bits of 16QAM) for 4 iterations,
2. Calculate the contribution of the higher reliability bit stream to the received signal and cancel that contribution from the received signal so as to reduce 16QAM to 4-QAM (this corresponds to FIGS. 3(i) to 3(iii)),
3. Detect the lower reliability bit stream (third and fourth bits of 16QAM) for 4 iterations,
4. Calculate the contribution of the lower reliability bit stream from the originally received signal to reduce interference in step 5 (this corresponds to FIGS. 3(iii) and 3(iv),
5. Detect the higher reliability bit stream (bits 1&2 of 16QAM) for 2 further iterations,
6. Update and cancel the contribution of the higher reliability bit stream from originally received signal so as to reduce 16QAM to 4-QAM (FIGS. 3(i) to 3(iii)),
7. Detect low reliability bit stream (bit 3&4 of 16QAM) for 2 further iterations (FIGS. 3(iii) and 3(iv)).

The received signal consists of contributions of all the bits of each symbol transmitted from all transmission (Tx) antennas with all spreading codes. The estimates of each received bit includes interference from other bits because the spreading codes are in practice never orthogonal (due to multipath propagation and code reuse). By cancelling the contributions from the bits transmitted with higher energy first, the interference (which is the sum of the contributions for the remaining bits) is reduced, and therefore the remaining bits can be detected more reliably.

A contribution is, of course, the energy with which a bit is expected to be received assuming it has been correctly determined.

Soft Output Combining After Decoding

In the proposed iterative receiver, mutual information is exchanged between the MF-SIC detector 3 and the convolutional decoder 13. Therefore, at each iteration, soft estimates (in the form of LLR values) at the output of the decoder are fed back to the detector for purposes of interference cancellation. The LLR values are also used to determine the order of detection of bits in the successive interference cancellation (MF-SIC) detector 3. Consequently, new and hopefully more reliable soft-output values are made available at the output of the decoder 13 after each iteration However, in some cases, the interference cancellation process can lead to poorer soft-outputs for certain bits. This can result in error propagation and therefore unstable bit-error rate performance in subsequent iterations.

Such instabilities may be avoided by combining in the soft output combiner 17 shown in FIG. 1, the soft-output values computed in the current iteration with those computed in the previous iteration(s) For that, each new LLR value L b, I of bit b consists of a weighted sum of the current and the previous LLR value Example proportions are 85:15 current to previous, or 70:30 current to previous The combining weight factors have a significant influence on the stability and the speed of convergence of the iterative receiver 2. Using this combining process, reliability information already gained for a certain transmitted bit is not lost in the next iteration.

While soft-output combining could have been performed either at the output of the detector 3 or that of the decoder 13, simulations indicate that the combination of both (i.e. soft output combiners 11',17) is most effective.

If q indicates the iteration reached, then the above-described soft-output combining may be described mathematically as $$y_{k,i}^n(t)[q] = \alpha y_{k,i}^n(t)[q] + (1-\alpha) y_{k,i}^n(t)[q-1] \quad (1)$$

$$\lambda_{k,i}^n(t)[q] = \beta \lambda_{k,i}^n(t)[q] + (1-\beta) \lambda_{k,i}^n(t)[q-1] \quad (2)$$

where $y_{k,i}^n$ is the detector output at time t where k is which of the spreading codes is used, n denotes which transmitting antenna is used, i indicates either the real or imaginary part of the constellation. $\lambda$ is the soft output—e.g., log likelihood ratio. Good performance results were found to be achieved via combining factors of $\alpha=0.9$ and $\beta=0.75$.

Signal Model

FIG. 1 illustrates the transmission scheme for the MIMO system under investigation. At the transmitter 1, user data is convolutional-encoded and interleaved The coded data stream is de-multiplexed into N T sub-streams, corresponding transmit antennas (Tx). Each sub-stream $(X_1, X_2, X_3, X_4)$ is then modulated on to NK 4-QAM orthogonal spreading codes prior to transmission. Each transmitted spread stream then occupies N symbolintervals. Also note that the same set of K codes are re-used across all transmit antennas. Therefore, the MIMO propagation environment, which is assumed to exhibit significant multipath, plays a major role in achieving signal separation at the receiver.

The transmitted signals are received by N R receive antennas after propagation through dispersive radio channels with impulse response lengths of W chips The received signal vector can then be modeled as follows:

$$\begin{bmatrix} {}^1 r \\ \vdots \\ {}^{N_R} r \end{bmatrix} = \begin{bmatrix} {}^1 H^1 & \cdots & {}^1 H^{n_T} \\ \vdots & & \vdots \\ {}^{n_R} H^1 & \cdots & {}^{n_R} H^{n_T} \end{bmatrix} \sum_{k=1}^{K} \begin{bmatrix} C_k' & \cdots & 0 \\ \vdots & & \vdots \\ 0 & \cdots & C_k' \end{bmatrix} \begin{bmatrix} x_k^1 \\ \vdots \\ x_k^{N_T} \end{bmatrix} + \begin{bmatrix} {}^1 v \\ \vdots \\ {}^{N_R} v \end{bmatrix} \quad (3)$$

$$r = H \sum_{k=1}^{K} C_k x_k + v \quad (4)$$

where ${}^m r \in C^{(QN+W-1) \times 1}$ and is the signal at Rx antenna m.

${}^m v \in C^{(QN+W-1) \times 1}$ and is the noise + inter-cell interference at Rx antenna m.

$\chi_k^n \in C^{N \times 1}$ and is the symbols sequence $[\chi_k^n(1) \ldots \chi_k^n(N)]^T$ at Tx antenna n spread via $k^{th}$ spreading code.

$C_k' \in C^{QN \times K}$ and is a the spreading matrix for $k^{th}$ spreading code $c_k \in C^{Q \times 1}$.

$$C_k' = \underbrace{\begin{bmatrix} c_k & \cdots & 0 \\ \vdots & \ddots & \vdots \\ 0 & \cdots & c_k \end{bmatrix}}_{N \text{ Times}}$$

${}^m H^i \in C^{(QN+W-1) \times QN}$ and is the channel matrix from Tx antenna i to Rx antenna m.

and $v$ is a vector of iid complex Gaussian variables, $R_v = E\{v v^H\} = N_0 I$. ($\in$ denotes, of course, takes the elements of.)

Iterative Receiver

At the receiver 2 of FIG. 1, signal vector $r$ is fed into a successive interference cancellation detector 3 incorporating matched filter detection (MF-SIC). The received signal of Eq. (4) observed over the $t^{th}$ symbol interval may be written as $$r(t) = \sum_{n=1}^{N_T} \sum_{k=1}^{K} a_k^n(t) x_k^n(t) + ISI + n(t) \in C^{N_R(Q+W-1)} \quad (8)$$

where $\chi_k^n(t)$ is a transmitted symbol at the $t^{th}$ symbol interval and $a_k^n(t)$ is its code-channel signature at the receiver. The output of the MF-SIC detector 3 is then de-interleaved by deinterleaver 12 and applied to a convolutional decoder 13. This represents the first iteration of the receiver. Soft outputs from the decoder are then re-interleaved by interleaver 16 and applied to the MF-SIC detector 3 for further iterations.

Iteration 1:

In the first iteration, the MF-SIC 3 operates at a symbol level. The first step is to determine, at each symbol epoch, t, the most reliable symbol according to a reliability criterion. Ideally, the symbol with the lowest error probability is selected. Lacking such information, the symbol $\chi_k^n(t)$ $k=1 \ldots K$ $n=1 \ldots N_T$ with the highest signature energy, $|a_k^n(t)|^2$ (or least mean-square estimation error), is selected. The next step is to estimate the selected symbol (soft-output derived via matched filter detection), make a hard decision on the estimate, reconstruct and cancel its contribution from the received signal:

$$y_k^n(t) = a_k^n(t)^H r(t) \quad (9)$$

$$r(t) = r(t) - a_k^n(t) \{sgn\{Re[y_k^n(t)]\} + jsgn\{Im[y_k^n(t)]\}\} \quad (10)$$

The process is then repeated for the next most reliable symbol. If the decision on the selected symbol is correct, then its interference towards other symbols can be completely suppressed. However, a wrong decision doubles the level of interference caused by the erroneously detected symbol. Consequently, the reliability criterion used for the ordering of symbols is of critical importance in any form of successive cancellation.

After the MF-SIC detection of a complete code-block by detector 3, the corresponding log-likelihood ratios in the form of soft-outputs, $y_{k,0}^n(t) = Re[y_k^n(t)]$ and $y_{k,1}^n(t) = Im[y_k^n$ (t)], are multiplexed into a single stream for de-interleaving by deinterleaver 12 and convolutional decoding (max-log MAP algorithm) by convolutional decoder 13. The decoder output is fed into the soft output combiner 17 and an interleaver 16 prior to re-application to the MF-SIC detector 3 for subsequent iterations.

Iteration 2 and Beyond:

In the second and each subsequent iteration of the receiver, the MF-SIC detector 3 has access to reliability information at a bit level, in the form of log-likelihood ratios, $\Lambda(b_{k,i}{}^n(t))$, generated by the soft-output combiner 17 in the previous iteration. As a result, at each symbol interval, t, ordering can be performed at a bit level (rather than symbol level) based on the LLR values. In other words, the bit $b_{k,i}{}^n(t)$ with the largest LLR value $|\Lambda(b_{k,i}{}^n(t))|$ (or minimum estimation error probability), can be selected as most reliable. Since bit estimates corresponding to a particular symbol can have different reliabilities, the use of LLR values represents an optimum ordering policy. The cancellation process at the $t^{th}$ symbol interval is based on the more reliable hard bit estimates derived from the LLR values:

$$y_{k,i}^n(t) = \frac{1}{2j^i}\{a_k^n(t)^H r(t) + (-1)^i r(t)^H a_k^n(t)\} \quad (11)$$

$$r(t) = r(t) - j^i a_k^n(t) \text{ sgn } \{\lambda(b_{k,i}^n(t))\} \quad (12)$$

where i=0 or 1 depending on whether the bit of interest forms the real or imaginary part of the 4-QAM symbol. The process is again repeated for the next most reliable bit. After the MF-SIC detection of a complete code-block, The soft-outputs, $y_i$, corresponding to a complete code-block are again multiplexed into a single stream for de-interleaving and decoding (MAP algorithm). The performance of the MF-SIC (and hence the receiver) should improve at each iteration as the quality of the decoder output improves.

Performance Comparison

A system with N T=N R=4 i.e. 4 transmitting antennas and 4 receiving antennas (operating with so-called transmission diversity), spreading factor Q=16 and number of codes used K=16, is considered, as similar to the HSDPA specifications. In addition to a flat Rayleigh fading channel, a dispersive (multipath) channel with 3 equal power taps (e.g., filter coefficients, in a tapped delay model) which are chip-spaced is also considered. Flat fading is, of course, where propagation does not involve multipath. It is assumed that the mobile speed is 3 km/h and the receiver has perfect knowledge of the average channel conditions during each transmitted data block. For the known APP detector with turbo-encoded MIMO link, a 8-state rate ⅓ turbo encoder is considered in accordance with the HSDPA specifications, resulting in a block size with up to 5114 information bits. A total of 6 iterations of the turbo decoder are performed in the known APP receiver. On the other hand, for the convolutionally-encoded MIMO link, rate ⅓, 64-state convolutional encoders (as shown in FIG. 1) are considered to allow a comprehensive comparison in terms of performance and complexity. 64 state means, of course, the number of states in the code. Rate ⅓ means that the coded message is three times as long as the information payload. A total of 6 iterations between the MF-SIC detector 3 and the convolutional decoder 13 are performed. Soft-output combiners 11',17 with the coefficients α=0.9 after detection and β=0.75 after decoding were used.

FIGS. 4 to 7 show the bit error rate BER and frame error rate FER performance for a flat fading channel and a dispersive (3 equal power taps, chip-spaced) channel of the iterative receiver 2 including MF-SIC detector 3 in comparison to the known APP based receiver, for 16-QAM and for 64-QAM. The known APP receiver uses turbo-coding according to the UMTS standard with 6 decoder iterations and a block size based on 1024 information bits →3072 coded bits (+tail).

As shown in FIGS. 4 and 5, the receiver 2 (with 16 QAM) offers superior performance in bit error rate and frame error rate for equivalent bit energy/noise energy ratios. FIGS. 6 and 7 show the approach also works at 64 QAM where the known APP detection approach becomes of extreme computational complexity.

FIG. 8 shows the achievable system throughput in a 5 MHz band with a chip rate of 3.84 MHz, 4 transmitting and 4 receiving antennas, and flat fading. The throughput is based on the frame-error rate simulation results for the receiver 2 including iterative MF-SIC detector 3. The result show that the error floor of the flat fading curves in FIGS. 5 and 7 do not have a significant influence on the obtainable system throughput rate (which is inversely related to the frame error rate).

The proposed MF-SIC receiver was compared with the known APP-based receiver considered for an equivalent turbo-encoded MIMO link and is shown to achieve superior performance at a much lower complexity. The performance loss due to the use of a sub-optimal detector is regained via iterations with the decoder, enabled by the soft-output combining technique in combination with the layered encoding scheme.

To summarise, it has been shown that the proposed layered coding scheme makes low complexity iterative receivers based on a simple matched filter possible for higher than 4QPSK modulations—e.g., 16 QAM and 64QAM modulations.

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Consequently, processing circuitry required to implement and use the described system may be implemented in application specific integrated circuits, software-driven processing circuitry, firmware, programmable logic devices, hardware, discrete components or arrangements of the above components as would be understood by one of ordinary skill in the art with the benefit of this disclosure. Those skilled in the art will readily recognize that these and various other modifications, arrangements and methods can be made to the present invention without strictly following the exemplary applications illustrated and described herein and without departing from the spirit and scope of the present invention It is therefore contemplated that the appended claims will cover any such modifications or embodiments as fall within the true scope of the invention.

The invention claimed is:

1. A system operative to communicate digital data symbols with higher than quadrature phase shift keying (QPSK) modulation, the system comprising a transmitter and a receiver comprising:

the transmitter comprising a modulator and means to split and encode the data into a first block of more significant bits of symbols and a second block of less significant bits of the symbols for modulating by the modulator;

the receiver being operative to receive digital data bits by iterative determination of soft estimates of bits followed by a hard decision as to what bit was intended, the receiver comprising:

a first processor operative to provide first soft estimates of bits of the received signal;

a second processor operative to decode the first soft estimates and to provide second soft estimates of the bits;

a first combiner operative to provide adapted first soft estimates to the second processor, the adapted first soft estimates of each bit being dependent upon a respective first soft estimate and a respective previous first soft estimate; and a second combiner operative to provide third soft estimates back to the first processor for subsequent further decoding, the third soft estimates of each bit being dependent upon a respective second soft estimate and a respective previous second soft estimate;

wherein the more significant bits are detected in the received signal in a first series of iterations, their estimated contribution to the received signal being subtracted to provide a modified received signal from which the less significant bits are detected by a second series of iterations.

2. A system according to claim 1, wherein the means comprises a first convolutional encoder operative to produce blocks of the more significant bits, a second convolutional encoder operative to produce blocks of less significant bits, and respective interleavers each operative to interleave the blocks from the associated encoder into a respective data stream for modulating.

3. A system according to claim 1, wherein the soft estimates of multiple data streams multiplexed into one stream at the output of the first processor, and provided to the first combiner to provide the adapted first soft estimates are deinterleaved by a deinterleaver before being passed to the second processor, and the third soft estimates provided by the second combiner interleaved by an interleaver before being passed back to the first processor.

4. A system according to claim 1, wherein the first processor is a successive interference cancellation SIC multiple input multiple output MIMO detector and the second processor is a convolutional decoder, the soft estimates being log likelihood ratios.

5. A system according to claim 4, wherein the SIC MIMO detector includes matched filters for detection.

6. A system according to claim 1, wherein the modulation scheme is 16 Quadrature amplitude modulation, the first two bits of a symbol being provided, by the first convolutional encoder, and the last two bits of a symbol being provided by the second convolutional encoder.

7. A system according to claim 1, wherein, a plurality of detection iterations each involving the first processor, second processor and the combiners are performed whereupon a hard decision is made.

8. A method of communicating digital data symbols with higher than quadrature phase shift keying ("QPSK") modulation method comprising the steps of:

splitting and encoding the data into a first block of more significant bits and a second block of less significant bits for modulating by a modulator;

receiving digital data bits by iterative determination of soft estimates of symbols or bits followed by a hard decision as to what bit was intended, by:

providing first soft estimates of bits of the received signal;

decoding the first soft estimates and providing second soft estimates of the bits;

providing adapted first soft estimates, the adapted first soft estimates of each bit being dependent upon a respective first soft estimate and a respective previous first soft estimate;

providing third soft estimates back for subsequent further decoding, the third soft estimates of each bit being dependent upon a respective second soft estimate and a respective previous second soft estimate;

wherein the more significant bits are detected in the received signal in a first series of iterations, their estimated contribution to the received signal being subtracted to provide a modified received signal from which the less significant bits are detected by a second series of iterations.

* * * * *